United States Patent [19]

Reele et al.

[11] Patent Number: 5,422,900
[45] Date of Patent: Jun. 6, 1995

[54] INTEGRATED LASER MODULE

[75] Inventors: Samuel Reele, Rochester; Alan L. Korus, Fairport, both of N.Y.

[73] Assignee: Eastman Kodak Company, Rochester, N.Y.

[21] Appl. No.: 234,446

[22] Filed: Apr. 28, 1994

[51] Int. Cl.6 .................................................. H01S 3/13
[52] U.S. Cl. .......................................... 372/29; 372/38; 372/69
[58] Field of Search ............................. 372/34, 65, 29, 38, 372/69

[56] References Cited

U.S. PATENT DOCUMENTS

| | | | |
|---|---|---|---|
| 4,747,091 | 5/1988 | Doi | 369/116 |
| 4,792,957 | 12/1988 | Kollanyi | 372/34 |
| 4,809,286 | 2/1989 | Kollanyi et al. | 372/38 |
| 4,813,045 | 3/1989 | Culpepper | 372/38 |
| 4,817,098 | 3/1989 | Hirokawa | 372/29 |
| 4,819,242 | 4/1989 | Kaku et al. | 372/38 |
| 4,912,715 | 3/1990 | Aoki et al. | 372/36 |
| 4,945,524 | 7/1990 | Igata | 369/44.11 |
| 4,978,844 | 12/1990 | Ujihara | 250/216 |
| 5,008,895 | 4/1991 | Martin | 372/69 |
| 5,107,476 | 4/1992 | Igata | 369/44.11 |
| 5,170,389 | 12/1992 | Numata et al. | 369/116 |
| 5,191,589 | 3/1993 | Amano et al. | 372/38 |
| 5,197,059 | 3/1993 | Minami et al. | 369/116 |
| 5,233,596 | 8/1993 | Tani | 369/116 |
| 5,250,796 | 10/1993 | Taguchi et al. | 250/205 |

FOREIGN PATENT DOCUMENTS

| | | | |
|---|---|---|---|
| 59-119547 | 7/1984 | Japan | G11B 7/12 |
| 60-1882 | 1/1985 | Japan | H01S 3/18 |
| 61-127191 | 6/1986 | Japan | H01S 3/18 |
| 61-202344 | 9/1986 | Japan | G11B 7/125 |
| 1-30034 | 1/1989 | Japan | G11B 7/125 |
| 2-244783 | 9/1990 | Japan | H01S 3/18 |
| 3-71774 | 3/1991 | Japan | H04N 1/23 |
| 4-264785 | 9/1992 | Japan | H01S 3/096 |

*Primary Examiner*—Léon Scott, Jr.
*Attorney, Agent, or Firm*—Edward Dugas

[57] ABSTRACT

An integrated laser module is formed with a laser having an input for receiving power and an output for emitting light being positioned so as to pass through a thermally conductive lower module body such that laser emitted light passes from the lower module body, and the lower housing acts as a heat sink. An HFI shielding substrate assembly is positioned in the lower module body adjacent to the laser with the laser input passing through the shielding substrate. A laser driver circuit is connected to the input of the laser, and an injection circuit is connected to the input to the laser and EMI shielded from the driver circuit. A top module body is fixed to the lower module body to form an EMI shield package around all of the components.

10 Claims, 5 Drawing Sheets

INTEGRATED LASER MODULE

CROSS-REFERENCE TO RELATED APPLICATIONS

The subject matter of the present Application is related to U.S. patent application Ser. No. 291,553, entitled "Laser Driver ASCI Chip", bearing Kodad Docket 69,959, filed on Aug. 16, 1994.

FIELD OF THE INVENTION

This invention relates to the field of laser packaging and more particularly to a compact modular arrangement of a laser and its associated electronics.

BACKGROUND OF THE INVENTION

It is extremely desirable in an optical CD writer as well as other CD systems to place the laser electronics, generally the laser driver and HFI (High Frequency Injection) circuitry, on the optical head with the laser. This is true because transmission line effects become less critical for laser driver rise/fall times at relatively small distances from the laser, EMI from HFI signals are easier to contain from the rest of the system not associated with the head, and overall the signal-to-noise ratio is improved. On the other hand, this close coupling of the high current laser driver circuitry, with a high frequency injection circuit, for quieting the laser noise in a small package or module, creates a system's packaging paradigm of trying to manage rather stringent thermal and electrical coupling requirements.

The integrated laser module of the present invention is designed to optimize rise and fall times in the order of 1–2 ns (nano sec), deliver up to 400 ma (milli-amps) of combined laser drive current during a Write mode, and to minimize EMI from a 200–500 Meg Hz high frequency injection (HFI) circuit in a cost effective, light weight, small package. Since lasers typically have parameters which shift adversely as a function of temperature, it is also important to provide an extremely low thermal resistance path for the laser driver which, in the preferred embodiment of this invention, is a custom ASIC circuit. For example 400 ma of Write current can result in up to 1.6 watts of power being generated during a Write cycle which typically exists for a 50% duty cycle at 5–6 Meg Hz. These temperature dependent laser parameters include wavelength, threshold, slope efficiency, and leakage, the change of which can significantly impact mark formation during a Write mode in an optical CD system. The threshold current change and slope efficiency changes at higher temperatures require that the laser driver current be increased to maintain a constant power level out of the laser. A constant power level is required for consistent writing quality and is critical as writing speeds approach and exceed six times the read speed. This increased current further adds to the temperature rise of the junction of the laser which in turn requires more current to the laser in order to maintain constant power. The present invention addresses this problem.

SUMMARY OF THE INVENTION

In a preferred embodiment of the integrated laser module there is provided:
a laser responsive to a control signal for generating a radiation beam;
a laser driver and logic circuitry connected to said laser for providing the control signal;
an injection circuit connected to said laser driver for providing an injection signal component to the control signal;
substrate means having electrical conductors thereon for electrically coupling said laser to said laser driver, said logic circuitry, and to said injection circuit; and
shielding means interposed between said injection circuit and said laser for shielding the radiation from said injection circuit from said laser.

This integrated laser module has particular utility in "compact disc" systems (i.e. audio as well as optical) where compact size and low cost are driving features. The incorporated laser driver circuit includes associated logic to generate Read, Write, and Boost laser drive currents. In addition, a high frequency injection circuit is incorporated to quiet the laser and to prevent mode hopping. The integrated laser module forms a self contained environment that decouples and shields the internal components from external and internal electromagnetic interference (EMI).

From the foregoing it can be seen that it is a primary object of the present invention to provide a compact packaging scheme for a laser and its associated circuitry.

It is another object of the present invention to provide a laser packaging arrangement that minimizes temperature effects.

It is yet another object of the present invention to provide a compact laser module with improved EMI protection, temperature stability, and optimized signal-to-noise ratio.

The above and other objects of the present invention will become more apparent when taken in conjunction with the following description and drawings wherein like characters indicate like parts and which drawings form a part of the present description.

DETAILED DESCRIPTION OF THE INVENTION

Figure 1:
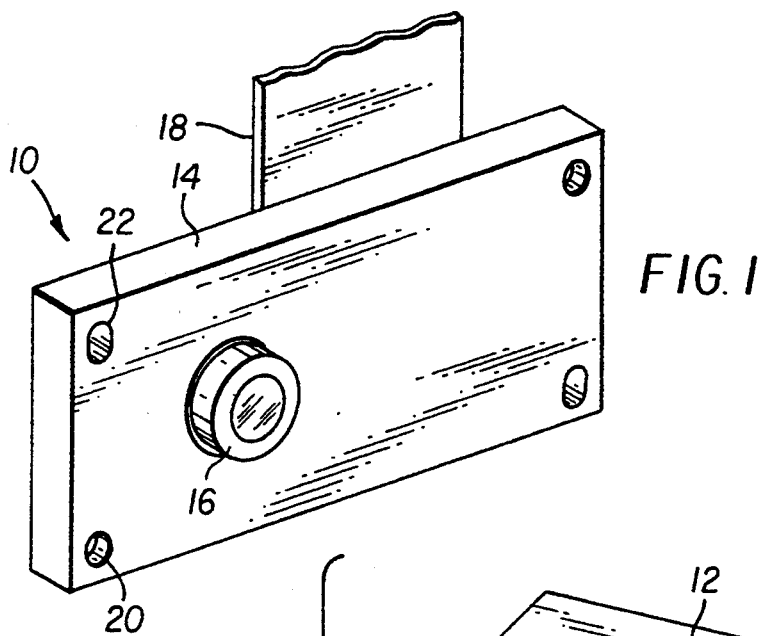
FIG. 1 illustrates, in perspective view, the integrated laser module.
Figure 2:
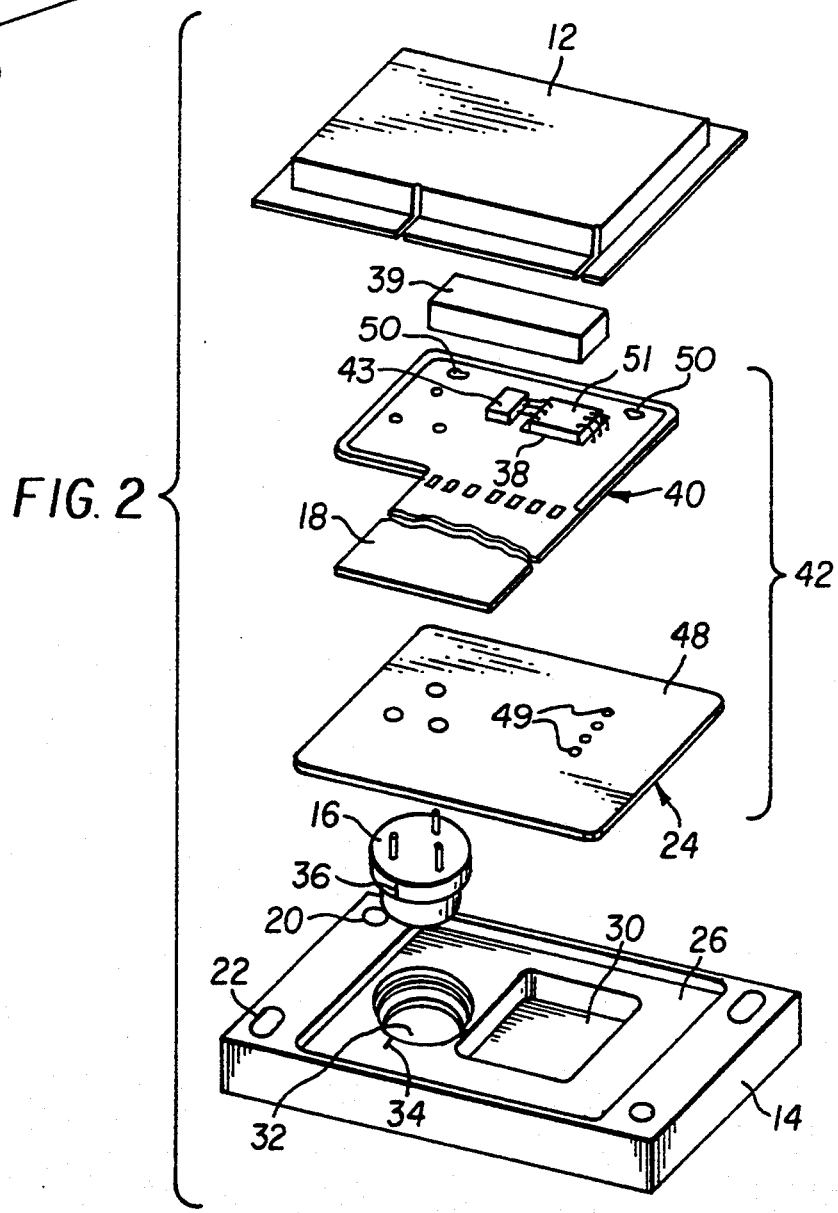
FIG. 2 illustrates, in exploded view, the integrated laser module of FIG. 1.
Figure 5A:
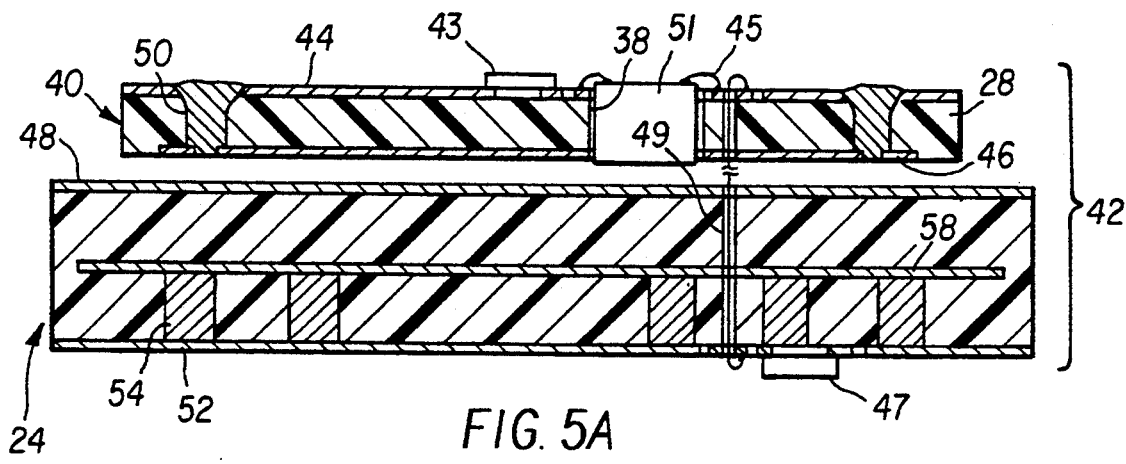
FIG. 5A is a section view taken along the section lines 5A—5A in FIG. 3.

Referring to FIGS. 1 and 2, the integrated laser module 10 is comprised, in major part, of a top can 12, lower housing 14, laser 16, a substrate assembly 42, and associated electronic components, for example 39 and 51, to be described in detail later. The lower housing 14 is formed of metal to provide the mechanical fixturing for the laser 16 and to act as the lasers main heat sink. The lower housing 14 is additionally part of an integral EMI shield, "Farady cage," for the HFI circuit (to be described later). The top can 12 provides part of the totally encompassing EMI shield for the laser's electronics. Elongated alignment holes 22 and holes 20 in the lower housing 14 provide a means to mechanically secure the laser module 10 to an optical Read/Write system after optical alignment. A flex tail 18 provides the electrical input/output interface between the laser module's internal laser electronics and the electronics of the optical Read/Write system. The lower housing 14 includes a recessed area 26 that is configured to receive the substrate assembly 42. The depth of the recess 26 is slightly less than the thickness of the substrate assembly 42, so that the top cap 12 can achieve good electrical contact with a ground plane 48 of the assembly 42. Additionally, in the recessed area 26, there is provided an aperture 32 that receives the laser 16. Indexing marks 34 and 36 are used to align the laser to the lower housing. A second recessed area 30 is formed within the recessed area 26 adjacent to the aperture 32. The second recessed area provides room for receiving the electronic components extending from the bottom side of the rigid substrate 24 (shown more clearly in FIGS. 4 and 5A). In the assembled laser module 10, the rigid substrate 24 fits over the laser 16 and provides physical support to the more flexible substrate 40 and to the associated components 43 and 51. The flexible substrate 40 is provided with an opening 38 to allow an ASIC 51 to be mounted directly to the copper ground plane 48 (see FIG. 5) on the surface of the rigid substrate 24 to provide a heat sink. An integrated capacitor filter array 39 is physically mounted onto the flexible substrate 40 and is connected in circuit to each of the conductors of the flex tail 18. In the preferred embodiment of the capacitor filter array, there is one capacitor assigned to each conductor in the flex tail 18, connecting between the assigned conductor and ground. Each capacitor is sized to provide filtering for the signals carried by its assigned conductor. For final assembly, the top can 12 is electrically bonded to the lower housing 14 to EMI seal the module 10 from electromagnetic and radio energy and to provide physical protection to the internal electronic components.

Figures 3, 4:
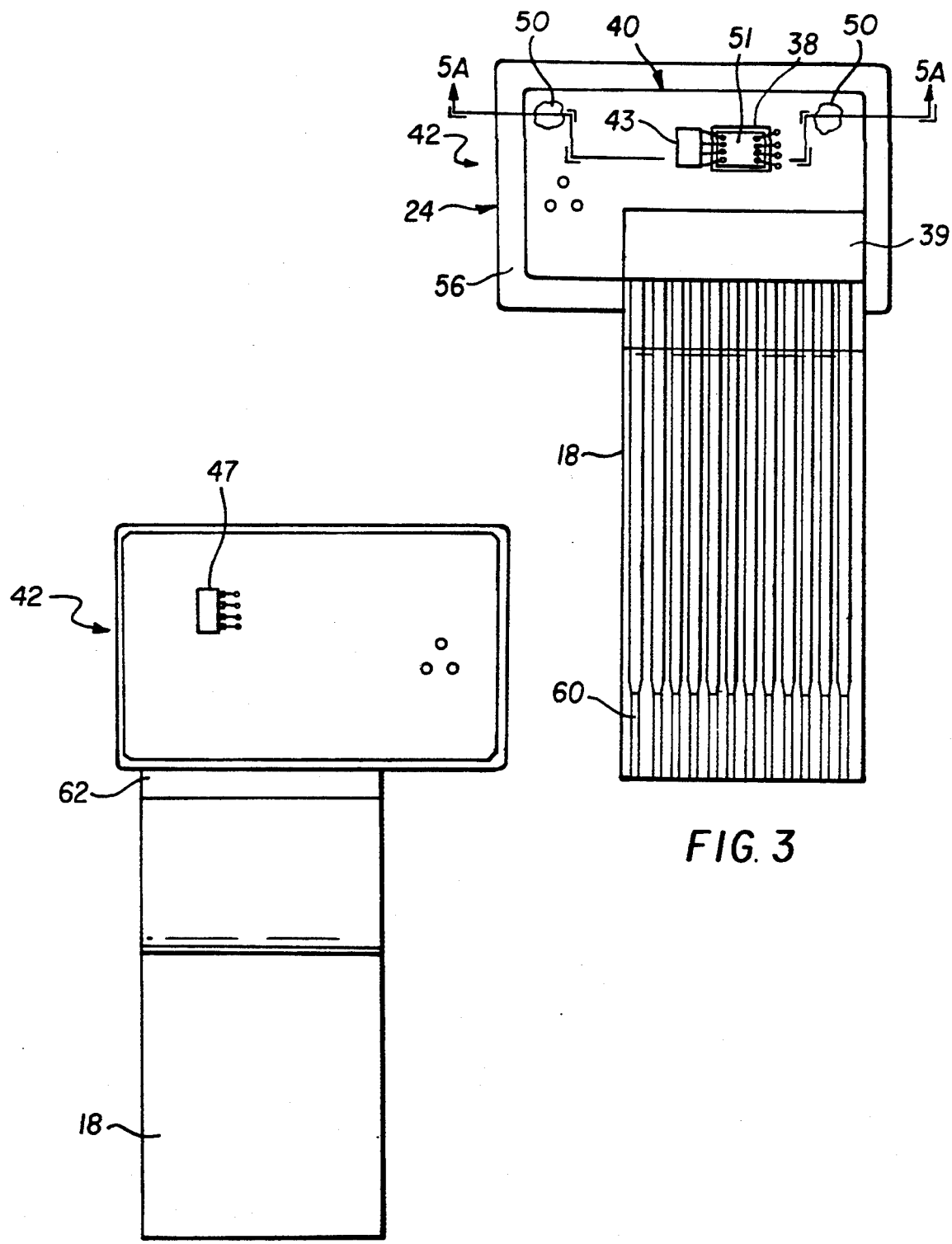
FIG. 3 is a top view of a substrate which supports a laser driver and associated logic circuitry.
FIG. 4 is a bottom view of the substrate of FIG. 3 shown supporting an HFI circuit and a laser.

FIGS. 3 and 4 illustrate the top side and bottom side, respectively, of the substrate assembly 42. For ease of understanding, FIGS. 3, 4 and 5A (which is a sectioned view of the substrate assembly) may be viewed together. The substrate assembly 42 is formed of two substrates, a wire bondable gold (Au) active flex 40, and the active rigid substrate 24 which is composed of FR-4 material. The two substrates can be laminated together with conductive epoxy, conductive adhesives, or traditional lead/tin (PbSb) solder. The wire bondable Au flex 40 has two levels of conductors, an upper side conductor 44 which is formed as circuit interconnects using a standard etching process, and a ground plane 46, separated by an insulating material 28.

The active flex 40 is designed such that it is inset from the ground plane 48 of the FR-4 substrate 24 so as to reveal a conductive border 56. After lamination, the border 56 provides a soldering surface for joining the top can 12 directly to the ground plane 48 and to the ground conductor(s) of the upper side conductor 44. In this way, the active flex 40 is not delaminated from the FR-4 substrate 24 by heat during the attachment of the top can 12 and a solid, flat laminated surface for the wirebonding of the ASIC laser driver die 51 is maintained. During the lamination process, the flex ground plane 46 is conductively attached to the ground plane 48 of the FR-4 substrate 24. In addition, tapered holes 50 in the flex 40 are filled with solder to further ensure electrical continuity between the ground conductor (s) of the upper side conductor 44, and ground planes 46 and 48. Tapering ensures that the Cu ground is exposed from any flex overcoat. As a result, there is a continuous metallic EMI shield in all dimensions for the upper side laser driver circuitry 43. The opening 38 under the ASIC die 51 is formed so that the body of the ASIC can be attached directly to the ground plane 48 of the FR-4 substrate. Since the ground plane 48 is very thick (1 oz Cu), this creates a low impedance thermal path to the top can 12 for the heat generated by the ASIC. This thermal path is independent from the thermal path between the lower housing 14 and the laser 16.

Referring specifically to FIG. 4, which illustrates the bottom side of the substrate 24, the positioning of the HFI circuit 47 is clearly shown. Electrical connections from the ASIC 51 to the HFI electronics is by way of bonding wires 45 passing through holes 49 in substrates 24 and 40.

The FR-4 substrate 24 contains three active conductor layers, a ground plane 48, an intermediate layer 58, and an HFI circuit interconnect 52 all insulated from each other by an insulating material 28.

The flex side ground plane 48 is a noise free ground and is part of the upper EMI shield, shielding the upper drive components 43 and 51 from the noisy HFI circuit 47. The intermediate layer 58 forms the HFI ground plane. This ground plane is part of the HFI ground shield which contains the EMI radiation from the HFI circuit 47.

Figure 5B:
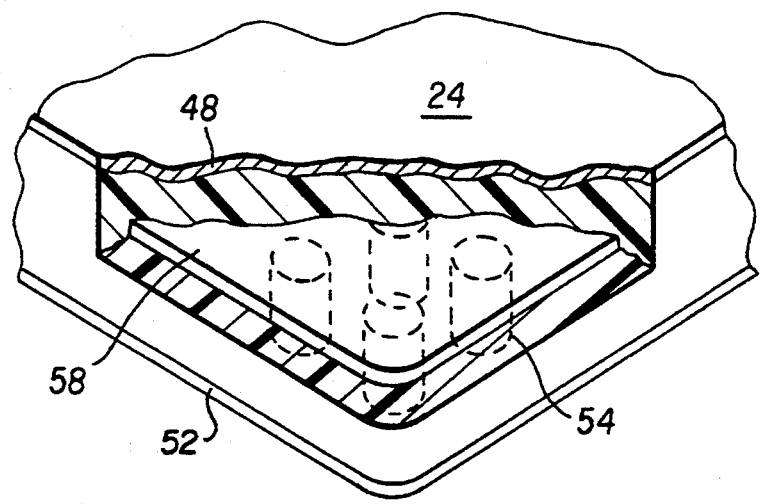
FIG. 5B is an exploded, cut away, view of a substrate 24.

The HFI interconnect layer 52 has a matrix of vias 54, connecting a ground ring on layer 52 to the intermediate layer 58 (HFI ground plane). This prevents EMI emissions from exiting through the sides of the FR-4 substrate 24. The lower housing 14 is soldered to the ground ring on the HFI interconnect layer 52. FIG. 5B illustrates a portion of the vias 54. The vias are of such a diameter and spacing Chat there is no clear path for EMI emissions along the planes represented by layer 58 and the interconnect layer 52.

The flex tail 18 contains plural conductors 60 on one side and a ground plane sheet 62, shown partially exposed in FIG. 4. The exposed portion of the ground plane contacts the lower housing 14 to eliminate EMI leakage from this area of the module.

In summary, the HFI EMI shield is formed by the intermediate layer 58, the matrix of vias 54, the ground ring on the bottom side interconnect layer 52, and the lower housing 14. In addition, a custom capacitor filter array 39 (see FIG. 2) is used to filter the input/output lines from EMI radiation. Additionally, the lower housing 14 provides a means to mechanically heat sink the laser 16 independently from the laser driver heat sink.

Figure 6:
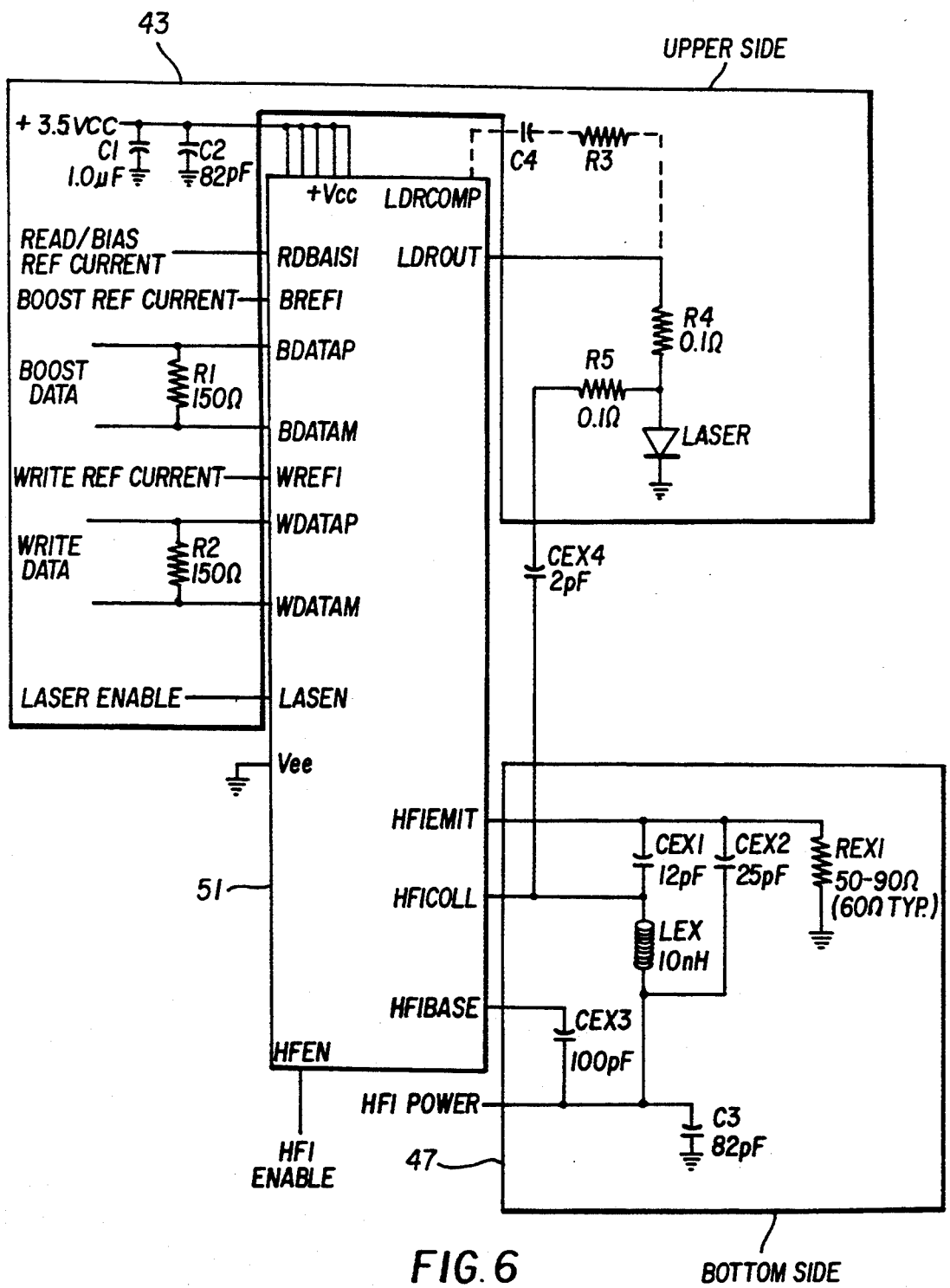
FIG. 6 illustrates, in schematic form, the electronics used in the integrated laser module.

FIG. 6 illustrates the electronic components 43 and 51 contained on the upper side and the components 47 contained on the bottom side of the substrate 42, along with the interconnections to the ASIC 51.

Figure 7:
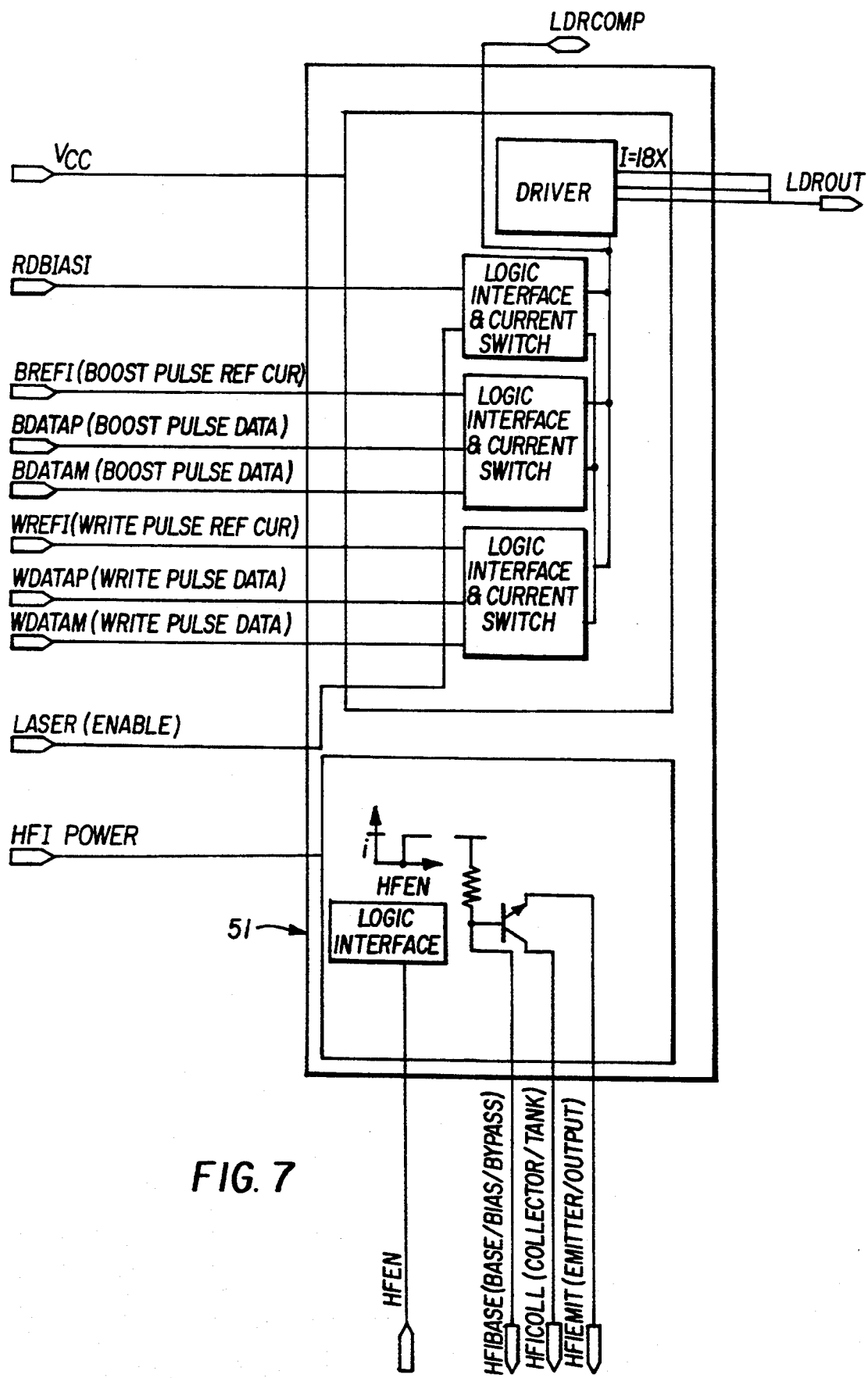
FIG. 7 illustrates, in block diagram form, an ASIC that may be used in the electronics of FIG. 6.

FIG. 7, is a block diagram of an ASIC 51 formed of four logic circuits and a driver circuit that may be used with the present invention. Other chips and/or discreet components that are within the knowledge of persons of ordinary skill in the art may be substituted for the ASIC and discrete components without detracting from the present invention.

The preferred method of assembling the laser module is set out in the following steps, with the understanding that many variants of these steps may be used based on the teachings of the present invention. As a result, it is the intent of this disclosure to cover those variants as well.

Assembly Procedure

1) The wirebondable Au flex substrate 40 and the active FR-4 substrate 24 are laminated into one integral substrate assembly 42, using conductive epoxy, conductive acrylics, conductive adhesives, or solder process. This provides rigidity to the flex substrate 40.
2) The upper side electrical components 43 (laser drive circuitry) are attached to the substrate 40 via a standard surface mount solder processes, for example, using PB60/SN40 at 240 Deg. C. or by a conductive epoxy.
3) The bottom side electrical components 47 (HFI circuitry) are attached to the substrate 40 via a standard surface mount solder processes, for example, using PB 5/Sn95 at 222 Deg. C. or by a conductive epoxy.
4) The laser driver ASIC die 51 is attached to the substrate 24 via a conductive epoxy, for example, using Abelbond 84 at 150 Deg. C. or a eutectic.
5) The laser driver ASIC die 51 is wirebonded to the substrate 40 conductors 44 or individual upper side components 43 via a standard gold ball bond or aluminum wedge bonding techniques.
6) The laser driver ASIC die 51 is coated with a glob coat, for example, using Ablestick or EPO-TEK # H62 to ensure that no light impinges on the silicon of the die.
7) The laser diode 16 is pressed into the lower housing 14.
8) The substrate 42 is attached to the lower housing via a conductive epoxy, for example, using Abelbond 84 or a low temperature solder.
9) The laser diode's leads are soldered through hole leads in substrates 24 and 40 to appropriate circuit conductors 44, for example, using Sn 60, Pb 40 at 188 Deg. C.
10) The module is tested for functionality.
11) The top can 12 is attached to the FR-4 ground plane 48 at the border 56 via a conductive epoxy, for example, using EPO-TEK H20E at 100 Deg. C. or a low temperature solder.
12) The completed module is tested with functional and parametric tests.

In conclusion, the present invention provides an integrated laser module that incorporates laser drive circuitry, a laser, and HFI circuitry in a compact size. The module meets thermal and HFI requirements, and additionally, the module incorporates a single substrate that utilizes the electrical component attachment technologies of wire bonding, dual sided surface mounting, soldered through hole techniques, as well as an integral HFI shield and an EMI containment shield resulting in a cost effective, lightweight module.

While there has been shown what is considered to be the preferred embodiment of the invention, it will be manifest that many changes and modifications may be made therein without departing from the essential spirit of the invention. It is intended, therefore, in the annexed claims, to cover all such changes and modifications as may fall within the true scope of the invention.

Parts List

10 Integrated laser module
12 Top can
14 Lower housing
16 Laser
18 Flex tail
20 Holes
22 Elongated alignment holes
24 Rigid FR-4 substrate
26 Recessed area
28 Insulating material
30 2nd recessed area
32 Aperture
34 Indexing mark
36 Indexing mark
38 Hole
39 Custom capacitor filter array
40 Flexible substrate
42 Substrate assembly
43 Upper side laser driver circuitry
44 Upper side conductors
45 Bonding wires
46 Ground plane
47 HFI circuit
48 Ground plane
49 Holes
50 Tapered holes
51 Custom laser driver ASIC die
52 HFI interconnect layer
54 Vias matrix surrounding the HFI circuit
56 Border
58 Intermediate layer
60 Conductors
62 Ground plane sheet

We claim:

1. An integrated laser module comprising:
   a laser responsive to a control signal for generating a radiation beam;
   a laser driver and logic circuitry connected to said laser for providing the control signal;
   an injection circuit connected to said laser driver for providing an injection signal component to the control signal;
   substrate means having electrical conductors thereon for electrically coupling said laser to said laser driver, said logic circuitry, and to said injection circuit; and
   shielding means interposed between said injection circuit and said laser for shielding the radiation from said injection circuit from said laser, whereby high laser module operating frequencies are attained with a substantial minimization of signal interference coupling.

2. An integrated laser module comprising:
   a laser having an input terminal for receiving a laser driving signal and an output for emitting light;
   a first module body housing in which said laser is mounted such that the emitted light passes from the first module body housing;
   a shielding substrate component positioned in the first module body housing adjacent the laser with the laser input terminal passing through said shielding substrate;
   a laser driver circuit for providing the laser driving signal to the input terminal of said laser;
   an injection circuit having an output electrically connected to the input terminal of said laser for providing an injection signal component to the laser driving signal;

shielding means for containing the radiation from said injection circuit; and a second module body housing fixed to said first module body housing to form a housing around said components, whereby high laser module operating frequencies are attained with a substantial minimization of signal interference coupling.

3. The integrated laser module according to claim 2 and further comprising:

a flex cable electrically connected to the laser driver circuit and to the injection circuit and passing through the formed housing for enabling the electrical connection of the laser module to a utilization system.

4. An integrated laser module comprising:

a laser responsive to a drive signal for generating a radiation beam;

a laser driver and logic circuitry for providing the drive signal to said laser;

an injection circuit for providing an injection signal component to said laser;

a first substrate means comprised of an insulating layer sandwiched between a ground plane and a layer of first circuit conductors;

a second substrate means comprised of an insulating body sandwiched between a layer of second circuit conductors and a ground plane and containing within the insulating body a shielding plane and a matrix of conducting components connecting the shielding plane to at least one of the second circuit conductors so as to form a shielded volume around said injection circuit, said first substrate means electrically attached to said second substrate means at their ground planes; and housing means surrounding the laser, laser driver and logic circuitry, and said first and second substrate means so as to form an integrated laser module, whereby high laser module operating frequencies are attained with a substantial minimization of signal interference coupling.

5. The integrated laser module according to claim 4 wherein said housing means is comprised of:

a first heat conducting housing portion having an aperture for receiving and maintaining said laser in thermal contact; and a second heat conducting housing portion thermally connected to said first heat conducting housing portion and to said second substrate means for dissipating the heat generated by said laser driver and logic circuitry, and said injection circuit.

6. An integrated laser module comprising:

a laser responsive to a control signal for generating a radiation beam;

a first thermally conductive, module housing portion supporting said laser;

laser driver and logic circuitry connected to said laser for providing the control signal;

an injection circuit for providing an injection signal component to the control signal;

substrate means having electrical conductors thereon for electrically coupling said laser to said laser driver and logic circuitry, and to said injection circuit and for providing a thermal heat path for said laser driver and logic circuitry, and said injection circuit; and a second thermally conductive, module housing portion fixedly connected to said first module housing portion for containing radiation from said injection circuit, whereby high laser module operating frequencies are attained with a substantial minimization of signal interference coupling.

7. The integrated laser module according to claim 6 wherein said laser driver and logic circuitry are formed as an ASIC which is mounted in thermal contact with said substrate means.

8. An integrated laser module comprising:

a laser responsive to a control signal for generating a radiation beam;

an injection circuit for providing an injection signal component to the control signal;

a first substrate means comprised of an insulating layer sandwiched between a ground plane and a layer of first circuit conductors;

a second substrate means comprised of an insulating body sandwiched between a layer of second circuit conductors and a ground plane and containing within the insulating body a shielding plane and a matrix of conducting components connecting the shielding plane to at least one of the second circuit conductors so as to form a shielded volume around said injection circuit, said first substrate means electrically attached to said second substrate means at their ground planes and said injection circuit connected to said second circuit conductors;

an ASIC laser driver having a body portion passing through an aperture in said first substrate means and thermally connected to the ground plane of said second substrate means; and housing means surrounding the laser, said ASIC laser driver and said first and said second substrate means to form an integrated laser module, whereby high laser module operating frequencies are attained with a substantial minimization of signal interference coupling.

9. The integrated laser module according to claim 8 and further comprising electrical circuit connections passing through said first substrate means between said laser driver and said layer of first circuit conductors and passing through said first and said second substrate means to said layer of second circuit conductors.

10. A method of forming an integrated laser module comprising the steps of:

laminating a flexible substrate with conductors thereon to a rigid substrate with conductors thereon to form an integral substrate assembly;

electrically attaching electrical components to the conductors on the flexible substrate;

electrically attaching electrical components to the conductors on the rigid substrate;

attaching a laser driver ASIC to the rigid substrate via an aperture in the flexible substrate;

wirebonding the pins of the laser driver ASIC to respective circuit conductors on the flexible substrate;

coating the laser driver ASIC with a glob coat;

inserting a laser within an aperture in a first thermally conductive housing portion;

attaching the integral substrate assembly to the first thermally conductive housing;

electrically attaching the laser's leads, through holes in the integral substrate assembly, to select conductors;

testing the functionality of the electrical components;

attaching a second thermally conductive housing portion to the border of the integral substrate assembly and to the first thermally conductive housing portion to form a module; and testing the module with functional and parametric tests, whereby high laser module operating frequencies are attained with a substantial minimization of signal interference coupling.

* * * * *